US006235641B1

(12) United States Patent
Christenson (10) Patent No.: US 6,235,641 B1
(45) Date of Patent: May 22, 2001

(54) METHOD AND SYSTEM TO CONTROL THE CONCENTRATION OF DISSOLVED GAS IN A LIQUID

(75) Inventor: Kurt K. Christenson, Minnetonka, MN (US)

(73) Assignee: FSI International Inc., Chaska, MN (US)

(*) Notice: Subject to any disclaimer, the term of this patent is extended or adjusted under 35 U.S.C. 154(b) by 0 days.

(21) Appl. No.: 09/183,718

(22) Filed: Oct. 30, 1998

(51) Int. Cl.[7] .................................................. H01L 21/00

(52) U.S. Cl. .............................. 438/706; 156/345; 216/92; 438/748

(58) Field of Search .................................. 438/706, 745, 438/748, 704; 216/57, 83, 73, 92; 156/345 L, 345 LS, 345 V (56) References Cited

U.S. PATENT DOCUMENTS

| Re. 36,290 | 9/1999 | Clark et al. .................... 29/25.01 |
|---|---|---|
| 932,898 | 8/1909 | Place . |
| 1,149,254 | 8/1915 | Dumars . |
| 2,812,861 | 11/1957 | Bickford ...................... 261/DIG. 42 |
| 2,876,188 | 3/1959 | Thorp et al. ........................ 204/176 |
| 3,555,783 | 1/1971 | Grimshaw ................................ 55/48 |
| 3,590,902 | 7/1971 | Walker et al. ................ 261/121.1 X |
| 3,650,151 | 3/1972 | Drexel .............................. 73/194 M |
| 3,653,182 | 4/1972 | Welch ..................................... 55/53 |
| 3,890,176 | 6/1975 | Bolon ....................................... 156/2 |
| 3,921,002 | 11/1975 | Williams et al. ..................... 250/533 |
| 3,935,041 | * | 1/1976 | Goffredo et al. ...................... 216/92 |

(List continued on next page.)

FOREIGN PATENT DOCUMENTS

| 2142630 | 8/1996 | (CA) . |
|---|---|---|
| 0 430 904 | 11/1989 | (EP) . |
| 0 380 962 | 8/1990 | (EP) . |
| 0 428 983 | 11/1990 | (EP) . |

(List continued on next page.)

OTHER PUBLICATIONS

International Search Report.

Kennes, et al., *Efficiency of Ozonated DI Water in Removing Organic Contamination*, 9 pages.

Fukazawa, et al., *An HF–$O_3$ Aqueous Solution for Silicon Wafer Cleaning*, pp. 267–270.

Talamp. et al., *Chemical Oxide Passivation for Very Thin Oxide Formation*, Mat. Res. Soc. Symp. Proc. vol. 315. 1993, pp. 381–386.

(List continued on next page.)

*Primary Examiner*—William Powell
(74) *Attorney, Agent, or Firm*—Faegre & Benson LLP (57) ABSTRACT

This invention relates to a method and system for establishing and maintaining a precise concentration of dissolved gas in a liquid. More particularly, the invention relates to a method and system of establishing and maintaining a precise concentration of dissolved gas in a liquid by utilizing a gas blend comprising a sufficient concentration of the desired gas so as to be in equilibrium with the desired concentration of the gas to be dissolved in the liquid, i.e., a "matched gas blend", to prepare a liquid admixture comprising the desired concentration of the gas. In this manner, the method and system of the present invention are able to produce liquid admixtures comprising precise concentrations of dissolved gas suitable for use in applications with tight specifications, and further, are capable of delivering the liquid admixture so produced to a point of use with substantially no loss of dissolved gas.

32 Claims, 7 Drawing Sheets

U.S. PATENT DOCUMENTS

| | | | |
|---|---|---|---|
| 4,051,886 | 10/1977 | Ross | 164/16 |
| 4,105,725 | 8/1978 | Ross | 261/122 |
| 4,172,786 | 10/1979 | Humphrey et al. | 210/57 |
| 4,176,206 | 11/1979 | Inoue | 427/82 |
| 4,220,460 | 9/1980 | Partus | 65/3 A |
| 4,276,243 | 6/1981 | Partus | 261/128 |
| 4,393,013 | 7/1983 | McMenamin | 261/64 |
| 4,483,826 | 11/1984 | Louthan | 261/DIG. 75 |
| 4,491,551 | 1/1985 | Johnson | 261/122.1 X |
| 4,507,253 | 3/1985 | Wiesmann | 261/22 |
| 4,540,531 | 9/1985 | Moy | 261/141 |
| 4,632,789 | 12/1986 | Reid | 261/63 |
| 4,666,480 | 5/1987 | Mann | 62/11 |
| 4,735,750 | 4/1988 | Damann | 261/29 |
| 4,749,640 | 6/1988 | Tremont et al. | 430/314 |
| 4,817,652 | 4/1989 | Liu et al. | |
| 4,874,509 | 10/1989 | Bullock | 210/169 |
| 4,885,047 | 12/1989 | Ury et al. | 156/345 |
| 4,900,336 | 2/1990 | Pittner et al. | 55/55 |
| 4,973,379 * | 11/1990 | Brock et al. | 438/748 |
| 5,014,727 | 5/1991 | Aigo | 134/102 |
| 5,071,485 | 12/1991 | Matthews et al. | 134/2 |
| 5,082,518 | 1/1992 | Molinaro | 156/345 |
| 5,087,323 * | 2/1992 | Park | 438/706 X |
| 5,100,521 | 3/1992 | Schwarzl | 204/176 |
| 5,181,985 | 1/1993 | Lampert et al. | 156/635 |
| 5,186,841 | 2/1993 | Schick | 210/760 |
| 5,215,592 | 6/1993 | Jackson | 134/1 |
| 5,221,423 | 6/1993 | Sugino et al. | 156/643 |
| 5,242,468 | 9/1993 | Clark et al. | 29/25.01 |
| 5,246,556 | 9/1993 | Sawamoto et al. | 204/176 |
| 5,278,104 | 1/1994 | Kodera et al. | 134/902 X |
| 5,342,415 | 8/1994 | Wasinger et al. | 8/111 |
| 5,378,317 | 1/1995 | Kashiwase et al. | 156/659.1 |
| 5,415,191 | 5/1995 | Mashimo et al. | 134/102.1 |
| 5,431,861 | 7/1995 | Naahiro et al. | 261/140.1 |
| 5,447,640 | 9/1995 | Omi et al. | 210/900 X |
| 5,460,705 | 10/1995 | Murphy et al. | 204/252 |
| 5,464,480 | 11/1995 | Matthews | 134/1.3 |
| 5,503,708 | 4/1996 | Koizumi et al. | 156/643.1 |
| 5,565,149 | 10/1996 | Page et al. | 261/140.1 |
| 5,591,349 | 1/1997 | Ikeda et al. | 210/760 |
| 5,624,734 | 4/1997 | Rees et al. | 422/186.11 |
| 5,626,769 | 5/1997 | Sawamoto | 210/760 |
| 5,632,847 | 5/1997 | Ohno et al. | 156/344 |
| 5,674,410 * | 10/1997 | Nakajima et al. | 216/92 |
| 5,676,760 | 10/1997 | Aoki et al. | 134/1.3 |
| 5,714,203 | 2/1998 | Schellenberger et al. | 427/378 |
| 5,756,054 | 5/1998 | Wong et al. | 422/186.08 |
| 5,776,296 | 7/1998 | Roger | |
| 5,843,307 | 12/1998 | Faivre et al. | 210/760 X |
| 5,896,875 | 4/1999 | Yoneda | 134/102.3 |
| 5,971,368 | 10/1999 | Nelson et al. | 261/64.3 |
| 6,080,631 | 6/2000 | Carter et al. | 430/329 |

FOREIGN PATENT DOCUMENTS

| | | |
|---|---|---|
| 0 428 93 A2 | 5/1991 | (EP) . |
| 0 548 596 | 11/1992 | (EP) . |
| 0 550 152 | 7/1993 | (EP) . |
| 0 587 889 | 3/1994 | (EP) . |
| 0 640 933 | 8/1994 | (EP) . |
| 0 702 399 | 9/1995 | (EP) . |
| 0 867 924 | 1/1998 | (EP) . |
| 1 545 559 | 5/1979 | (GB) . |
| 60-114393 | 6/1985 | (JP) . |
| 62-221426 | 9/1987 | (JP) . |
| 1-130785 | 5/1989 | (JP) . |
| 1-257103 | 10/1989 | (JP) . |
| 1306787 | 12/1989 | (JP) . |
| 3-089995 | 4/1991 | (JP) . |
| 3-154690 | 7/1991 | (JP) . |
| 4-346895 | 12/1992 | (JP) . |
| 6-182366 | 7/1994 | (JP) . |
| 6277476 | 10/1994 | (JP) . |
| 8045886 | 2/1996 | (JP) . |
| WO 96/01593 | 1/1996 | (WO) . |
| WO 97/26308 | 7/1997 | (WO) . |
| WO 98/46340 | 10/1998 | (WO) . |
| WO 99/52654 | 10/1999 | (WO) . |

OTHER PUBLICATIONS

Tong, et al., *Aqueous Ozone Cleaning of Silicon Wafers*, FSI International Technical Report TR 376, Oct. 7, 1991, 7 pages.

Wei, et al., *Ozone use for post–ashing resist stripping: Mechanisms and recent findings*, 1997 Semiconductor Pure Water and Chemicals Conference, pp. 81–97.

Ohmi, *Very high quality thin gate ozide formation technology*, J. Vac. Sci. Technol. vol. _, 1995, pp. 1665–1670.

Kogure, et al., *Ozonied Ultrapure Water Treatment of Organic Contamination on Si–Wafer Surface*, Institute of Environmental Sciences 1993 Proceedings, pp. 380–385.

Hoignee, et al., *The Role of Hydrozyl Radical Reactions in Ozonation Processes in Aqueous Solutions*, Water Research vol. 10, 1975, pp. 377–387.

* cited by examiner

METHOD AND SYSTEM TO CONTROL THE CONCENTRATION OF DISSOLVED GAS IN A LIQUID

FIELD OF THE INVENTION

This invention relates to a method and system for establishing and maintaining precise concentrations of dissolved gas in a liquid. More particularly, the invention relates to a method and system of establishing and maintaining a precise concentration of dissolved gas in a liquid by indirectly or directly contacting a gas blend comprising a sufficient concentration of the desired gas so as to be in equilibrium with the desired concentration of the gas to be dissolved in the liquid, i.e., a "matched gas blend".

BACKGROUND OF THE INVENTION

The manufacture of semiconductor devices involves numerous steps that are generally directed toward forming one or more layers on a semiconductor wafer substrate. For example, in the case of silicon wafers, a wafer is generally oxidized to form a layer of silicon dioxide on the surface of the wafer. All, or selective portions, of this silicon dioxide layer are subsequently removed via etching to expose the silicon wafer therebelow. Following etching, additional layers may be added to the etched silicon wafer, via thin film deposition or growth processes. These layers may then also be etched or otherwise treated to produce functional features on the surface of the silicon wafer.

The processes utilized to deposit and/or etch these layers, as well as the processes used to clean the wafers between steps, rely heavily on chemical reagents. In many instances, these chemical reagents comprise one or more gases dissolved in a liquid. Inasmuch as process parameters, such as the etch rate, quality of the etch, uniformity of the etch, and the like, are at least partially dependent upon on the concentration of the dissolved gas in the liquid, the concentration of the dissolved gas in the liquid is desirably controlled within tight specifications. If the concentration of the dissolved gas in the liquid is allowed to vary, undesirable manufacturing variations may result, or in the least, these chemical reagents will not perform optimally.

Unfortunately, controlling the concentration of a dissolved gas in a liquid to the degree necessary for such admixtures to be useful in many semiconductor manufacturing processes is difficult. As a result, variations in concentration can affect processing quality. For example, in some manufacturing processes of semiconductor devices, it is desirable to controllably etch copper so as to provide functional features on the surface of a semiconductor wafer. However, some copper etching applications may require etching precisely 5 nm of copper with less than a 5% variation. At least in this instance, variations in gas concentration are unacceptable.

Furthermore, although several methods of controlling the concentration of dissolved gas in a liquid are known, each of these prior art methods has limitations that render them inadequate for certain applications. For example, bubbling the gas that is to be dissolved directly into the liquid has been used as a method to dissolve gases into a variety of different kinds of liquids. Such a technique, however, does not optimize the quantity of gas dissolved or the amount of gas that remains in solution at the point of use. Control over the dissolved gas concentration when utilizing this approach is complicated by the pressure of the liquid into which the gas will be dissolved.

Additionally, several methods utilize cooling to increase the quantity of gas that may be dissolved into a liquid. Although such methods claim to increase the quantity of dissolved gas, these methods do not focus upon precise control of the concentration of the dissolved gas either at the outset or at the point of use. Thus, it is possible that the increased amount of gas, if any, that is dissolved into the liquid as a result of cooling the liquid will effervesce out of the liquid admixture at the point of use.

Thus, there is a need for an efficient method of establishing and maintaining a precise quantity of dissolved gas in a liquid admixture, not only to minimize the amount of gas that must be utilized, but also to provide liquid admixtures comprising sufficiently precise concentrations of dissolved gas so as to be useful for applications requiring tight specifications.

SUMMARY OF THE INVENTION

According to the present invention, the above objectives and other objectives apparent to those skilled in the art upon reading this disclosure are attained by the present invention which is drawn to a method and system for establishing and maintaining precise concentrations of dissolved gas in a liquid. Specifically, the method and system of the present invention utilize a "matched gas blend," i.e., a gas blend that has been prepared to have a concentration of the gas (or gases) to be dissolved that would be in equilibrium with a liquid admixture comprising the desired concentration of the gas(es). By directly or indirectly contacting the liquid with the matched gas blend before and/or at the point of use, a precise amount of gas dissolves in the liquid as the liquid comes to equilibrium with the gas. It is possible, as a result, to controllably adjust the amount of dissolved gas in a liquid with great precision within a wide range of possible concentrations merely by adjusting the composition of the matched gas blend. In this manner, the present invention provides an exceptionally effective method and system for producing and using liquid admixtures comprising precise amounts of dissolved gas in applications subject to tight specifications. As a result of the ability of the system of the present invention to establish and maintain a precise concentration of dissolved gas in a liquid, the resulting admixtures are expected to be particularly useful to prepare liquid admixtures that may be utilized to treat, i.e., clean, oxidize, develop, etch, etc., substrates processed in the manufacture of semiconductor devices.

In one aspect, the present invention provides a system for contacting a substrate with a liquid including a predetermined concentration of a gas dissolved in the liquid. The system comprises a chamber in which at least one substrate can be positioned for treatment with the liquid containing the dissolved gas. A liquid supply comprising the liquid is provided. A liquid supply line is in fluid communication with the chamber through which the supply comprising the liquid can be dispensed into the chamber. A matched gas supply comprising a matched gas blend is also provided. At least one gas supply line is in fluid communication with the chamber so that the matched gas supply comprising the matched gas blend can be dispensed into the chamber, preferably concurrently with the liquid supply. Optionally, the at least one matched gas supply line is in mass transfer contact with the liquid supply line so that a predetermined concentration of the gas can be pre-dissolved in the liquid supply before the liquid supply is dispensed into the chamber.

In another aspect, the present invention provides a method of treating a substrate with a liquid admixture comprising a dissolved gas. Generally, the method involves causing a matched gas blend to directly or indirectly contact a liquid such that the liquid comes to equilibrium with the matched gas blend, thus forming the liquid admixture which comprises the liquid and a concentration of the dissolved gas. The resulting liquid admixture comprising the liquid and the dissolved gas is then caused to contact a substrate, thereby treating at least a portion of the surface of the substrate.

The matched gas blend may be caused to come into direct or indirect contact with the liquid in a number of ways, which may be carried out alone or in combination. For example, the liquid may be atomized in the presence of the matched gas blend, the liquid may be atomized by impact with the matched gas blend, the liquid may be pre-contacted with the matched gas blend prior to being dispensed at the point of use, the liquid may be atomized with itself in the presence of the matched gas blend, the liquid may be pre-contacted with the matched gas and then dispensed into a defined volume also comprising the matched gas blend, combinations of these, and the like.

As used herein, the term "aqueous" means any fluid admixture that contains water as a solvent, including impure water. The phrase "ultrapure deionized water", as used herein, means "ultrapure deionized water" as defined as in, for example, the pamphlet "Balazs Analytical Laboratory's Pure Water Specifications and Guidelines For Facility and Fabrication Engineers," Balazs Analytical Laboratory, Sunnyvale, Calif., 1993. As used herein, the term "atomize" means that a stream, or streams, of one or more liquids is reduced to a plurality of droplets. Atomizing can occur through any suitable technique, including spraying through an atomizing nozzle, breaking up a liquid by mechanical agitation, impacting a liquid with another fluid stream, and the like.

BRIEF DESCRIPTION OF THE FIGURES

The above mentioned and other advantages of the present invention, and the manner of attaining them, will become more apparent and the invention itself will be better understood by reference to the following description of the embodiments of the invention taken in conjunction with the accompanying Figures, wherein.

DETAILED DESCRIPTION OF THE INVENTION

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The difficult engineering challenge of establishing and maintaining a precise concentration of dissolved gas in a liquid chemical is due to a fundamental behavior of gases which can be described in terms of Henry's Law. Henry's Law describes the equilibrium between a liquid and its vapor. This law states that, at equilibrium at a given temperature, the vapor pressure of the dissolved gas (the solute) in the surrounding ambient will be proportional to the solute concentration in the liquid. Mathematically, Henry's Law can be represented by the expression:

$$P_g = k[g]_e$$

wherein $P_g$ is the solute vapor pressure; k is Henry's Constant which varies from gas to gas; and $[g]_e$ is the equilibrium concentration of the dissolved gas in the liquid. For purposes of the present invention, the solute vapor pressure in a gas blend may be given by the expression:

$$P_g = (n_g/N)P$$

wherein $P_g$ is as defined above, $n_g$ is the moles of gas in the gas blend, N is the total moles of gas in the blend, and P is the pressure of the gas blend. In actual practice, some gas solutes may strictly obey Henry's Law, while others may not. Generally, dilute solutions having an undissociated solute at a concentration of 0.1 moles/liter or less tend to conform to Henry's Law. In any instance, however, the basic principles of Henry's Law still apply, because a gas solute will always tend to equilibrate with its vapor and vice versa. The equilibrium relationship between the solute concentration and its vapor pressure, whether proportional or otherwise, can always be determined empirically using conventional techniques.

Because of Henry's Law, a certain amount of dissolved gas is typically lost when a liquid comprising the dissolved gas as a solute is exposed to the ambient, i.e. is dispensed at a point of use. That is, according to Henry's Law, a certain amount of dissolved gas must leave the dispensed liquid in order for equilibrium to be established with the surrounding environment. In closed environments, e.g., if a liquid admixture comprising an amount of dissolved gas is dispensed into a closed chamber, a finite amount of the dissolved gas will be lost into the chamber volume above the liquid, leaving a reduced concentration of dissolved gas remaining in the liquid. In open environments, e.g., outdoors, or in a chamber in which a steady flow of gas is maintained through the chamber, equilibrium with the ambient may never really be established, and as a result, substantially all of the dissolved gas may be lost.

For example, soda pop contains carbon dioxide ($CO_2$) gas dissolved in a liquid. When a soda can or bottle is opened in a large room, thereby exposing the liquid admixture to an open environment, the soda pop initially fizzes as a portion of the dissolved $CO_2$ effervesces and is lost to the open environment. In a relatively short time, nearly all of the dissolved $CO_2$ will effervesce, leaving behind a beverage with a flat taste and little if any $CO_2$ solute.

In many instances, the drive to reach equilibrium is extremely strong and surprisingly rapid. For example, when oxygenated water is dispensed into a chamber as atomized droplets that are intended to contact wafers to be treated with the oxygenated water, substantially all of the oxygen in the water can be lost in just the short time it takes the droplets to travel from the atomizing structure to the substrates to be treated. The desired treatment, e.g., etching, may not occur to any significant extent when this happens.

People have tried a number of different approaches to overcome Henry's Law. One approach involves overformulation. With this approach, excess gas is dissolved into the liquid in efforts to counteract the effervescence that will occur when the liquid is dispensed in hopes that a sufficient amount of gas will remain dissolved in the liquid to produce the desired effect. This approach suffers from significant drawbacks. First, the amount of gas that will be lost can be roughly estimated, but unfortunately cannot be determined with the level of precision needed to meet the rigorous specifications necessary in some semiconductor manufacturing processes. Second, some gases may have such a high Henry's Constant that even overformulation cannot prevent loss of substantially all of the dissolved gas from the dispensed liquid.

Another approach that has been utilized in efforts to overcome Henry's Law involves minimizing the surface area of the dispensed liquid. For example, Assignee's co-pending U.S. patent application Ser. No. 08/960,277 describes a method of dispensing ozonated water in which the ozonated water is atomized in the form of large droplets having a relatively low surface area. Because the rate at which dissolved gases escape into the ambient depends upon surface area, this approach slows the escape of ozone so that a sufficient amount of ozone advantageously remains in the liquid droplets to effectively treat the targeted substrates. Although satisfactory for some applications, this "gentle" atomization approach nonetheless still does not provide enough control over dissolved gas content needed to satisfy more stringent process specifications.

In contrast to these previous approaches, the present invention provides an extremely effective way to establish and maintain precise concentrations of dissolved gas in a liquid. When utilizing the system and methods of the present invention, there is no need to overformulate. Furthermore, vigorous atomization can be used to form extremely fine sized droplets having a relatively large surface area. As a result of the precise control provided by the system and method of Applicants' invention, the liquid admixtures produced may advantageously be utilized to improve the effectiveness and uniformity of certain surface treatments performed in the manufacture of semiconductor devices.

Rather than attempt to fight Henry's Law, the present invention works with Henry's Law to ensure that little if any dissolved gas is lost to the ambient when a liquid comprising the dissolved gas is dispensed at a point of use. More specifically, the present invention uses one or both of the following strategies to establish and/or maintain precise concentrations of a dissolved gas in a liquid:

(1) a "matched gas blend" is used to dissolve a very precise amount of gas in a liquid; and/or (2) a liquid admixture comprising an amount of dissolved gas is dispensed at the point of use in the presence of a "matched gas blend". (In some embodiments, this is accomplished by atomizing the liquid with the matched gas blend. In others, the matched gas is independently present at the point of use. Combinations of these approaches can also be used.)

The use of a "matched gas blend" to establish and maintain precise concentrations of a gas solute in a liquid is one important feature of the invention. The term "matched gas blend" refers to a gas blend including an amount of the gas to be dissolved that would be in equilibrium with the desired concentration of the dissolved gas in the liquid. For example, a gas blend at 25° C. and 1 atmosphere (atm) and comprising 2.22 mole percent of oxygen and the balance nitrogen would be in equilibrium with water containing 1 part per million (ppm) dissolved oxygen. Thus, this gas blend would be a "matched gas blend" with respect to oxygenated water for which the desired oxygen concentration is 1 ppm. A matched gas blend may be used to prepare a liquid chemical with a very precise concentration of dissolved gas simply by allowing the gas and liquid to interact under conditions such that the liquid comes to equilibrium with the matched gas blend. This interaction can occur before and/or at the point of use.

The matched gas blend in accordance with the present invention may also be used to prevent loss of dissolved gas at a point of use. For example, a liquid admixture comprising an amount of dissolved gas can be dispensed into a processing chamber pre-flooded with the matched gas blend. Because the liquid chemical and the matched gas blend are already at least substantially at equilibrium, there is no equilibrium driving force that would tend to change the concentration of dissolved gas in the liquid admixture. The liquid admixture is thus able to contact the substrates and accomplish the desired treatment with substantially no loss of dissolved gas.

Figure 1:
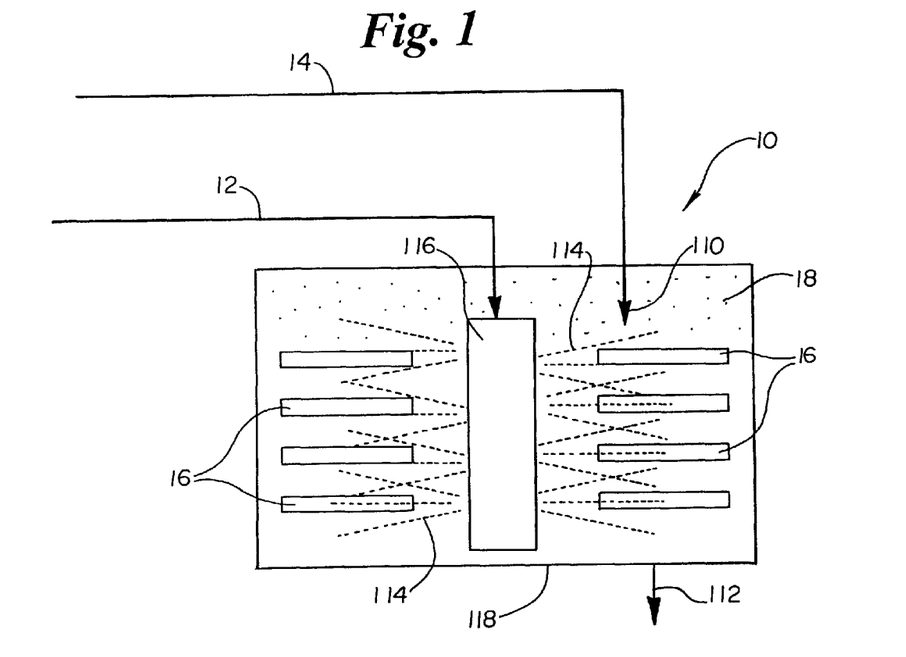
FIG. 1 is a schematic illustration of one representative system capable of treating a plurality of substrates with a liquid admixture comprising a dissolved gas in accordance with the present invention, wherein the liquid admixture is formed by dispensing the liquid at the point of use in the presence of a matched gas blend.
Figure 2:
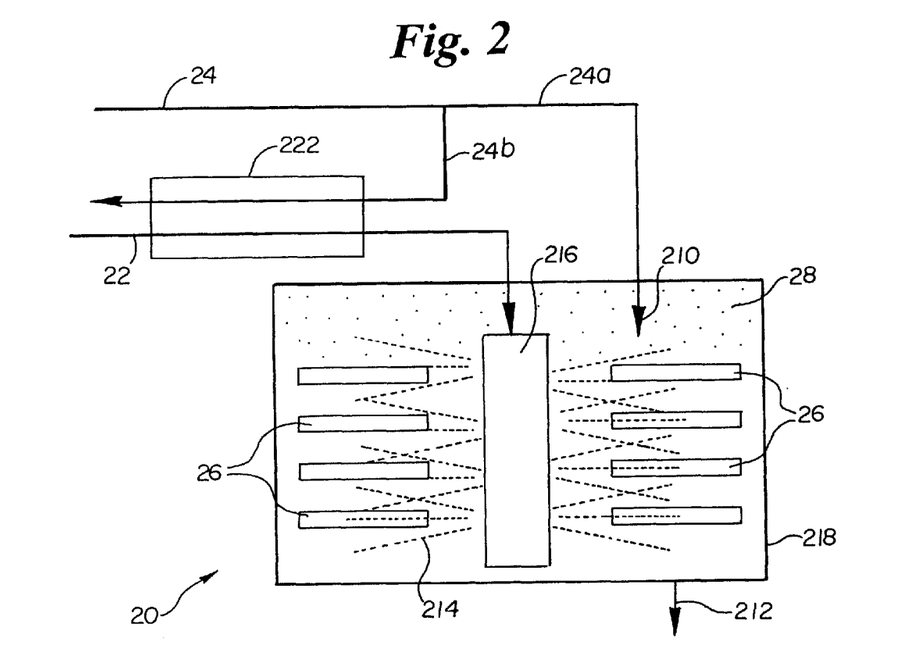
FIG. 2 is a schematic illustration of a second representative system capable of treating a plurality of substrates with a liquid admixture comprising a dissolved gas in accordance with the present invention, wherein a liquid is precontacted with a matched gas blend to form a liquid admixture which is then dispensed at the point of use in the presence of a matched gas blend.

Referring now to FIG. 1, there is illustrated system 10 embodying the principles of the present invention. System 10, as illustrated, is adapted for the treatment of one or more substrates 16 with a liquid admixture comprising a dissolved gas. The liquid admixture is formed by dispensing the liquid at the point of use in the presence of a matched gas blend independently delivered to the point of use. Generally, system 10 comprises chamber 118, liquid supply line 12, matched gas supply line 14 and exhaust and drain line 112. Chamber 118 is capable of housing one or more substrates 16 that are to be treated upon contact with atomized droplets 114.

Figure 3:
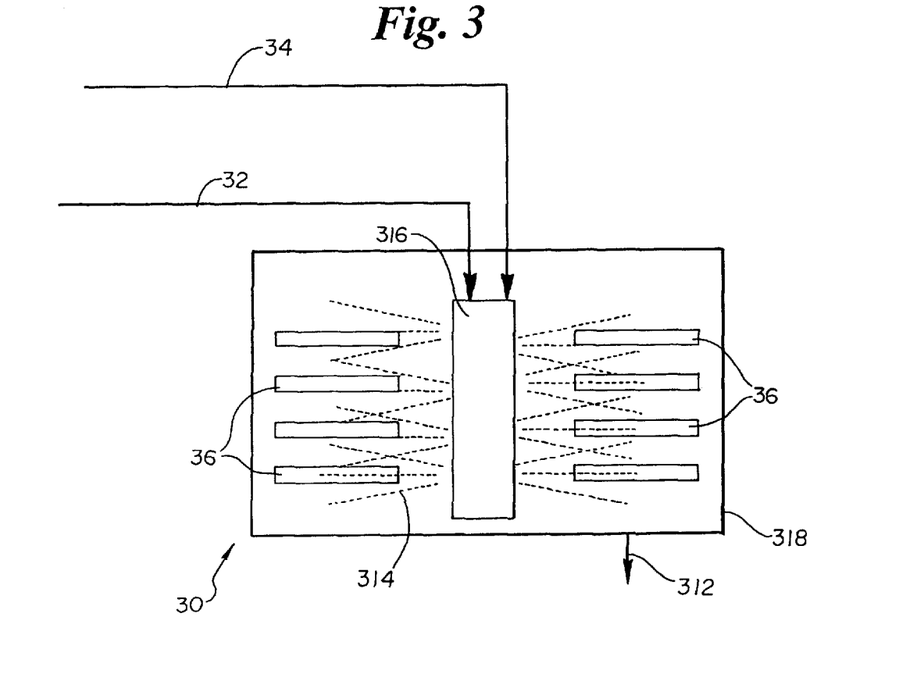
FIG. 3 is a schematic illustration of a third representative system capable of treating a plurality of substrates with a liquid admixture comprising a dissolved gas in accordance with the present invention, wherein the liquid admixture is formed by atomizing the liquid with a matched gas blend at the point of use.

Liquid supply line 12 serves to supply liquid from a liquid source (not shown) into chamber 118. Liquid supply line 12 terminates at, and is operationally coupled to, atomizing nozzle 116 such that the liquid is dispensed into chamber 118 in the form of atomized droplets 114. Additionally, matched gas supply line 14 delivers matched gas blend 18 into chamber 118 through matched gas inlet 110. Inside chamber 118, atomized droplets 114 and matched gas blend 18 are in intimate contact with each other so that atomized droplets 114 and matched gas blend 18 tend to come into equilibrium with each other. As a result, a concentration of the gas becomes dissolved in atomized droplets 114 that substantially corresponds to the amount of the gas in matched gas blend 18. Atomized droplets 114 then contact, and thereby treat, at least a portion of the surface(s) of substrates 16.

Because of the tendency of atomized droplets 114 and matched gas blend 18 to quickly come into equilibrium with each other, the concentration of the gas that will be dissolved in atomized droplets 114 may easily be controlled by adjusting the relative amount of the gas in matched gas blend 18. For example, to increase the concentration of gas that will be dissolved in atomized droplets 114, the amount of gas in matched gas blend 18 would be increased. To decrease the concentration of gas that will be dissolved in atomized droplets 114, the amount of gas in matched gas blend 13 would be decreased. A convenient way of forming a matched gas blend is to combine the one or more desired gases and a carrier gas at volumetric flows effective to provide the desired matched gas blend. For example, 2.5 liters per minute of oxygen can be blended with 97.5 liters per minute of nitrogen to form a matched gas blend with 2.5% oxygen expressed as a volume percent. A suitable carrier gas is preferably and inert gas such as nitrogen, helium, argon, or combinations thereof.

Exhaust and drain line 112 is provided so that the pressure within chamber 118 can be controlled by venting matched gas blend 18 and/or used liquid from chamber 118. Additionally, any of lines 12, 14 and 112 may optionally comprise a flow regulating device (not shown) to regulate the flow of liquid, matched gas blend, and exhaust, respectively.

Referring now to FIG. 2, there is illustrated a second example of system 20 suitable for carrying out the principles of the present invention. FIG. 2 is a schematic representation of system 20 useful for treating one or more substrates with a liquid admixture comprising a dissolved gas. Generally, system 20 comprises chamber 218, liquid supply line 22, matched gas supply line 24 and exhaust and drain line 212. Chamber 218 is capable of housing one or more substrates 26 that are to be treated upon contact with atomized droplets 214.

Liquid supply line 22 serves to supply liquid from a liquid source (not shown) into chamber 218. A matched gas blend 28 is supplied through matched gas supply line 24. Matched gas supply line 24 is bifurcated into matched gas blend chamber supply line 24*a* and matched gas supply line 24*b*. Matched gas supply line 24*b* delivers matched gas blend 28 to gasifier 222, preferably in a direction counter to the flow of liquid through gasifier 222, and preferably under conditions such that the liquid comes to equilibrium with the matched gas blend 28 within gasifier 222. The resultant gasified liquid, i.e., liquid comprising an equilibrium amount of the desired gas solute, leaves gasifier 222 via liquid supply line 22. Liquid supply line 22 terminates at, and is operationally coupled to, atomizing nozzle 216. Atomizing nozzle 216 is structured such that the gasified liquid is dispensed into chamber 218 in the form of atomized droplets 214. Additionally, matched gas supply line 24*b* delivers matched gas blend 28 into chamber 218 through matched gas inlet 210. Consequently, atomized droplets 214 and matched gas blend 28 are in intimate contact with each other, so that little, if any, of the dissolved gas content of the droplets is lost upon atomization. Atomized droplets 214 then contact, and thereby treat, at least a portion of the surface(s) of substrates 26.

Exhaust and drain line 212 is provided so that the pressure within chamber 218 can be controlled by venting matched gas blend 28 and/or used liquid from chamber 218. Additionally, any of lines 22, 24, 24*a*, 24*b* and 212 may optionally comprise a flow regulating device to regulate the flow of liquid, matched gas blend, liquid/matched gas blend combinations or exhaust, as the case may be.

Referring now to FIG. 3, there is illustrated yet another system 30 embodying the principles of the present invention. System 30, as illustrated, is adapted for the treatment of one or more substrates with a liquid admixture comprising a dissolved gas. In the embodiment of the invention illustrated by FIG. 3, the liquid admixture is formed by atomizing the liquid at the point of use by atomizing impact with a matched gas blend. Generally, system 30 comprises chamber 318, liquid supply line 32, matched gas supply line 34 and exhaust and drain line 312. Chamber 318 is capable of housing one or more substrates 36 that are to be treated upon contact with atomized droplets 314.

Liquid supply line 32 serves to supply liquid from a liquid source (not shown) into chamber 318. Liquid supply line 32 terminates at, and is operationally coupled to, atomizing nozzle 316 located inside chamber 318. Additionally, matched gas supply line 34 terminates at, and is operationally coupled to, atomizing nozzle 316. Atomizing nozzle 316 has a structure that causes at least one fluid stream comprising liquid and at least one fluid stream comprising matched gas blend 38 to impinge upon each other such that the liquid is atomized into a mist of atomized droplets 314. A preferred embodiment of atomizing nozzle 316 is described in more detail below in connection with FIGS. 8 and 9. The intimate contact provided by the atomization process results in atomized droplets 314 quickly reaching an equilibrium with matched gas blend 38. Atomized droplets 314 then contact, and thereby treat, at least a portion of the surface(s) of substrates 36.

Exhaust and drain line 312 is provided so that the pressure within chamber 318 can be controlled by venting matched gas blend (not shown in FIG. 3) and/or used liquid from chamber 318. Additionally, any of lines 32, 34 and 312 may optionally comprise a flow regulating device to regulate the flow of liquid, matched gas blend, and exhaust, respectively.

Figure 4:
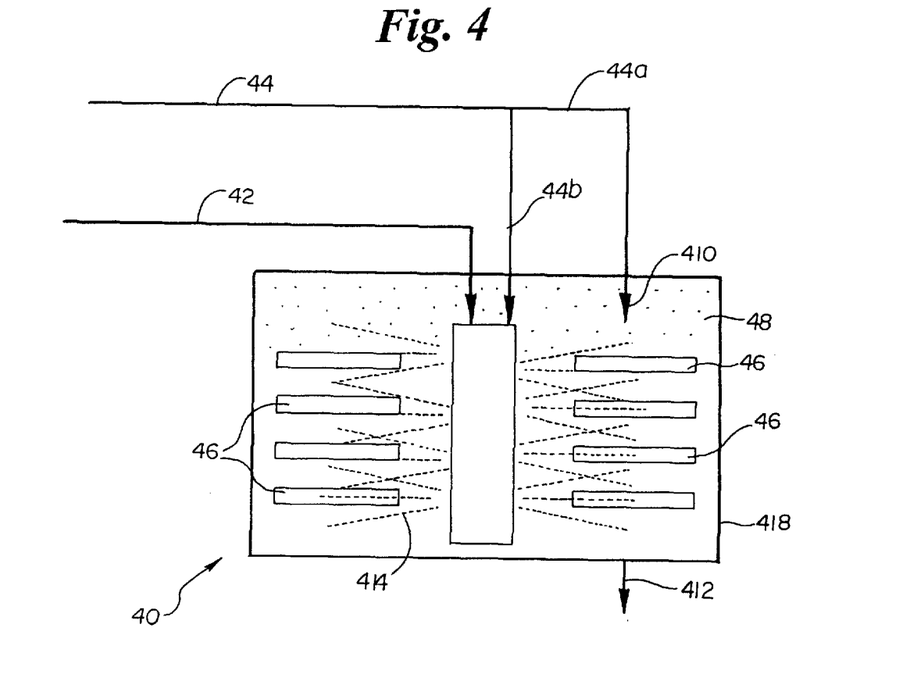
FIG. 4 is a schematic illustration of a fourth representative system capable of treating a plurality of substrates with a liquid admixture comprising a dissolved gas in accordance with the present invention, wherein the liquid admixture is formed by atomizing the liquid with a matched gas blend at the point of use in the presence of a matched gas blend.

FIG. 4 illustrates yet another embodiment of system 40 for carrying out the principles of the present invention. FIG. 4 is a schematic representation of system 40 useful for treating one or more substrates with a liquid admixture comprising a dissolved gas. Specifically, FIG. 4 illustrates an embodiment of the invention in which the liquid admixture is formed by both atomizing the liquid with a matched gas blend and independently supplying the matched gas blend to the point of use. Generally, system 40 comprises chamber 418, liquid supply line 42, matched gas supply line 44 and exhaust and drain line 412. Chamber 418 is capable of housing one or more substrates 46 that are to be treated upon contact with atomized droplets 414.

Liquid supply line 42 serves to supply liquid from a liquid source (not shown) into chamber 418. A matched gas blend is supplied through matched gas supply line 44. Matched gas supply line 44 is bifurcated into matched gas chamber supply line 44a and matched gas supply line 44b. Matched gas supply line 44b delivers matched gas blend 48 to atomizer nozzle 416, while matched gas supply line 44a delivers matched gas blend 48 into chamber 418 through matched gas inlet 410. Liquid supply line 42 terminates at, and is operationally coupled to, atomizing nozzle 416 located inside chamber 418. Atomizing nozzle 416 has a structure that causes at least one fluid stream comprising liquid and at least one fluid stream comprising matched gas blend to impact each other such that liquid is atomized into a mist of atomized droplets 414.

The intimate contact provided by the atomization process results in atomized droplets 414 quickly reaching an equilibrium with matched gas blend 48. Additionally, since chamber 418 is flooded with matched gas blend 48, atomized droplets 414 are also at equilibrium with the chamber ambient. By providing two means by which the liquid and/or atomized droplets 414 come into intimate contact and reach equilibrium with matched gas blend 48, system 40 provides enhanced control over the resulting concentration of dissolved gas in atomized droplets 414. Atomized droplets 414 then contact, and thereby treat, at least a portion of the surface(s) of substrates 46.

Exhaust and drain line 412 is provided so that the pressure within chamber 418 can be controlled by venting matched gas blend 48 and/or used liquid from chamber 418. Additionally, any of lines 42, 44, 44a, 44b and 412 may optionally comprise a flow regulating device to regulate the flow of liquid, matched gas blend, liquid/matched gas blend combinations or exhaust, as the case may be.

Figure 5:
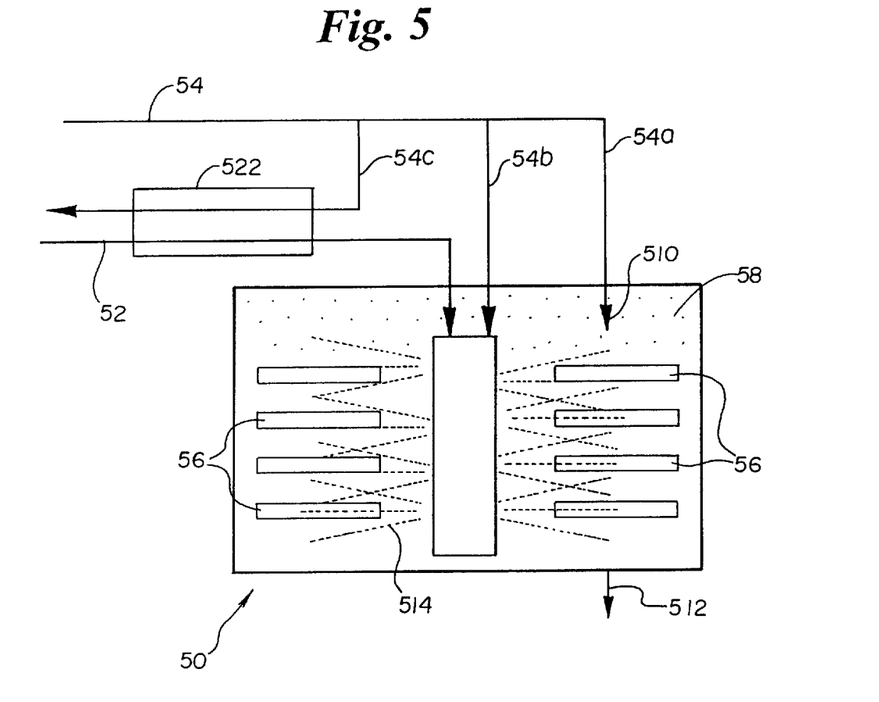
FIG. 5 is a schematic illustration of a fifth representative system capable of treating a plurality of substrates with a liquid admixture comprising a dissolved gas in accordance with the present invention, wherein the liquid admixture is formed by precontacting a liquid with a matched gas blend which liquid admixture is subsequently atomized with a matched gas blend at the point of use in the presence of a matched gas blend.

Referring now to FIG. 5, there is illustrated another embodiment of system 50 for carrying out the principles of the present invention. FIG. 5 is a schematic representation of system 50 useful for treating one or more substrates 56 with a liquid admixture comprising a dissolved gas. More specifically, FIG. 5 illustrates an embodiment of the invention wherein the system 50 precontacts the liquid with a matched gas blend 58, atomizes with a matched gas blend 58, and floods the point of use with a matched gas blend 58. Generally, system 50 comprises chamber 518, liquid supply line 52, matched gas supply line 54 and exhaust and drain line 512. Chamber 518 is capable of housing one or more substrates 56.

Liquid supply line 52 serves to supply liquid from a liquid source (not shown) into chamber 518. A matched gas blend is supplied through matched gas supply line 54. Matched gas supply line 54 splits into matched gas supply line 54a, matched supply line 54b and matched supply line 54c. Matched gas supply line 54a delivers matched gas blend 58 into chamber 518 through matched gas inlet 510, while matched gas supply line 54b delivers matched gas blend 58 to atomizer nozzle 516. Matched gas supply line 54c delivers matched gas blend 58 to gasifier 522, preferably in a direction counter to the flow of liquid through gasifier 522. The resultant gasified liquid leaves gasifier 522 via liquid supply line 52. Liquid supply line 52 terminates at, and is operationally coupled to, atomizing nozzle 516 located inside chamber 518. Atomizing nozzle 516 has a structure that causes at least one fluid stream comprising liquid and at least one fluid stream comprising matched gas blend to impact each other such that liquid is atomized into a mist of extremely fine atomized droplets 514.

Since the liquid and matched gas blend 58 are precontacted in gasifier 522, the resultant gasified liquid comprises an amount of dissolved gas that is in equilibrium with the amount of gas in matched gas blend 58. Furthermore, the intimate contact provided by the atomization process helps to maintain the equilibrium between the liquid and matched gas blend 58. Finally, since chamber 518 is flooded with matched gas blend 58, atomized droplets 514 are also at equilibrium with the chamber ambient. Consequently, little, if any, of the dissolved gas content of the droplets is lost upon atomization. By providing three means by which the liquid and/or atomized droplets 514 come into intimate contact and reach equilibrium with matched gas blend 58, system 50 provides enhanced control over the resulting concentration of dissolved gas in atomized droplets 514. Atomized droplets 514 then contact, and thereby treat, at least a portion of the surface(s) of substrates 56.

Exhaust and drain line 512 is provided so that the pressure within chamber 518 can be controlled by venting matched gas blend 58 and/or used liquid from chamber 518. Additionally, any of lines 52, 54, **54*a*, 54*b* and 512** may optionally comprise a flow regulating device to regulate the flow of liquid, matched gas blend, liquid/matched gas blend combinations or exhaust, as the case may be.

The present invention is very versatile and can be used to treat a wide variety of different substrates in a wide variety of different ways. One particularly useful application of the present invention involves preparing liquid chemicals containing one or more dissolved gases that can be used to controllably etch substrates in the context of the manufacture of semiconductor devices. In many etching processes, it is the one or more reactive gases in the liquid chemical that cause etching to occur. Accordingly, the rate of etching is highly dependent upon the concentration of dissolved gas in the liquid. Because the method and system of the present invention allow the quantity of dissolved gas to be established and then maintained with great precision, that method and system can be used to etch semiconductor substrates with great precision.

For example, FIG. 6 shows one illustrative embodiment of such a system, generally designated by the numeral 60, that can be used to etch copper surfaces on semiconductor substrates 66. System 60 is able to establish very precise concentrations of dissolved oxygen ($O_2$) gas in a liquid chemical. As an overview, system 60 is designed first to prepare liquid droplets 620 comprising aqueous hydrofluoric acid (HE) and $O_2$ gases dissolved in ultrapure deionized water and then to cause those droplets to contact substrates 66 to accomplish etching.

Interestingly, using only HF or $O_2$ alone in the water does not provide good etching performance, but the use of both gaseous ingredients works quite well. While not wishing to be bound by any theory, it is believed that this is because the etching of metallic copper in DHF is an electrochemical process wherein each copper atom loses two electrons and is dissolved as the "oxidized" species $Cu^{+2}$. As the copper loses two electrons and is oxidized, some other species must accept the two electrons and be "reduced". The species that accepts the electrons from the copper and is reduced is called the oxidizing species, named for its effect on the copper. See, e.g., K. Christenson, S. Smith and D. Werho, "Removing Metallic Contaminants in an RCA-2 Clean as a Function of Blend Ratio and Temperature," *Microcontamination Magazine*, Canon Communications, Santa Monica, Calif., June, 1994; H. Morinaga and T. Ohmi, "Electrochemical Deposition and Removal of Metallic Impurities On Si Surfaces," in Cleaning Technology in Semiconductor Device Manufacturing IV, R. E. Novak and J. Ruzyllo eds., The Electrochemical Society, Pennington, N.J., PV95-20 (1996) p. 257–268; and M. Pourbaix, "Atlas of Electrochemical Equilibria in Aqueous Solutions," Pergamon Press, London (1966).

Figure 6:
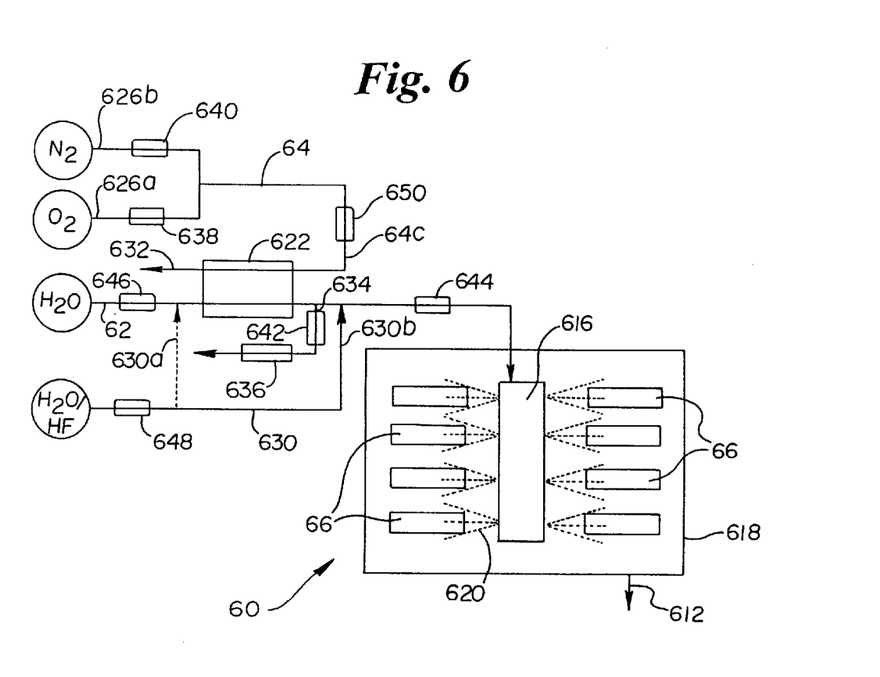
FIG. 6 is a detailed process diagram of a sixth representative system capable of treating a plurality of substrates with a liquid admixture comprising a dissolved gas in accordance with the present invention, wherein the liquid admixture is formed by precontacting a liquid with a matched gas blend.

In more detail, system 60 comprises treatment chamber 618 in which a plurality of substrates 66 are positioned to be etched. In a preferred embodiment, chamber 618 is the treatment compartment of a centrifugal spray processor of the type commercially available from FSI International, Chaska, Minnesota, under one or more of the trade designations MERCURY®, SATURN®, or TITAN®. In such commercial devices, a plurality of wafer cassettes (not shown), each capable of holding 25 wafers corresponding to substrates 66, are rotatably supported upon a rotating turntable (not shown) as the treatment chemical in the form of droplets 620 is dispensed into chamber 618 through spray post 616. The droplets 620 contact the spinning wafer substrates 66 to accomplish etching in a very controlled manner. A preferred embodiment of spray post 616 is described in more detail below in connection with FIGS. 8 and 9. Generally, spray post 616 includes at least one complementary set, and preferably a plurality of complementary sets, of passages through which liquid streams and streams of matched gas blend supplied to spray post 616 can be ejected in such a manner that at least one ejected liquid stream impacts at least one complementary ejected gas stream. The liquid stream is atomized into a mist of droplets 620 as a result.

To prepare the liquid chemical dispensed through spray post 616, ultrapure deionized water is supplied to system 60 via liquid supply line 62. The flow rate of ultrapure deionized water through liquid supply line 62 is controlled by flow regulator 646. In order to be used to etch the copper on the surfaces of substrates 66, precise quantities of $O_2$ and HF need to be dissolved in the water. In order to dissolve the predetermined concentration of $O_2$ gas in the water that will be effective to carry out etching at the desired etch rate (e.g., the copper etch rate is about 7 nm/min per 10 ppm of dissolved $O_2$), a matched gas blend of $O_2$ and nitrogen ($N_2$) is prepared by supplying $O_2$ gas through gas supply line 626a and $N_2$ through gas supply line 626b. Flow controllers 638 and 640 control the volumetric flow rate of each gas so that the resultant matched gas blend formed in gas supply line 64 contains a precise amount of $O_2$ effective to provide the desired dissolved $O_2$ concentration when the matched gas blend and gasified water are in equilibrium with each other. For example, a gas blend comprising 2.22 mole percent $O_2$ and 97.78 mole percent $N_2$ corresponds, at equilibrium, to a concentration of dissolved $O_2$ in water of 1 ppm at 25° C. at 1 atm of pressure. In this sense, if the desired concentration of dissolved $O_2$ in the water is 1 ppm, then, for purposes of the present invention, a matched gas blend comprising 2.22% $O_2$ and 97.5% $N_2$ on a mole basis would be a matched gas blend for that particular concentration specification at 25° C. and 1 atm.

After the matched gas blend is prepared by combining streams of $O_2$ and $N_2$ at the desired molar ratio, the matched gas blend is caused to flow through a suitable device 622 that allows the matched gas blend and water to contact each other under conditions such that the liquid comes to equilibrium with the matched gas blend. The matched gas blend enters device 622 via matched gas blend supply line 64c and is vented via exhaust and drain line 632. The flow rate of matched gas blend through matched gas blend/liquid contact line 64b is controlled by flow regulator 650.

In a preferred embodiment, device 622 is a membrane contactor in which gas from the matched gas blend diffuses into the liquid through one or more membranes separating the matched gas blend from the liquid. Preferably, such a contactor is of the type including a plurality of tubes housed inside a main shell. One of the liquid or matched gas blend is transported through the inside of the tubes, while the other is transported (preferably in counter-current fashion) outside of the tubes. The tube walls are formed from a suitable membrane to allow equilibrium between the matched gas blend and the liquid to be reached.

A representative membrane contactor is the Separel EFM-350 Degasification Module commercially available from the Pall Corporation, East Hills, N.Y. The Separel unit includes bundles of very fine hydrophobic fibers that act as a diffusion membrane. In this membrane contactor, liquid flows across the skinned outside surface of the fibers and the matched gas blend counter-flows through the hollow cores of the fibers. The hydrophobic nature of the membrane prevents the passage of liquid. Gas diffuses into the liquid across the membranes. This interchange of gases equilibrates the concentrations of dissolved gases in the liquid with those in the matched gas blend. See, for example, "Membrane Permeation of Liquids and Gasses," Perry's Chemical Engineer's Handbook, 6th ed., D. W. Green, Ed., McGraw-Hill, New York, 1984, p. 17–14. The oxygen containing water leaves membrane contactor 622 and flows towards spray post 616 via liquid supply line 62. The flow rate of water to spray post 616 is controlled by flow regulator 644.

After leaving membrane contactor 622 a portion of the oxygenated water can be diverted via line 634 to measuring device 636. Measuring device 636 is generally a device that allows the oxygen concentration in the water to be monitored for quality control purposes. The flow rate of oxygenated water through measuring device 636 is controlled by flow regulator 642.

Prior to reaching spray post 616, a concentrated solution of HF in deionized water (DHF) can be blended into the oxygenated water via supply line 630. The flow rate of DHF through supply line 630 is controlled by flow controller 648. The DHF may be added either upstream (via supply line 630a shown as a dashed line) or downstream (via supply line 630b) from membrane contactor 622. Adding DHF via upstream supply 630a provides the advantage of enhanced control over the amount of HF and $O_2$ that will be dissolved in water. The resultant liquid chemical containing HF and $O_2$ dissolved in water then enters spray post 616 via liquid supply line 62. As will be described in more detail in connection with FIGS. 8 and 9, a plurality of liquid chemical streams are ejected from spray post 616 atomized to form droplets 620 that contact and etch substrates 66.

In the course of etching substrates 66, used chemicals may be desirably withdrawn from chamber 618 through appropriate outlets. For purposes of illustration, exhaust and drain line 612 is shown for this purpose.

Figure 7:
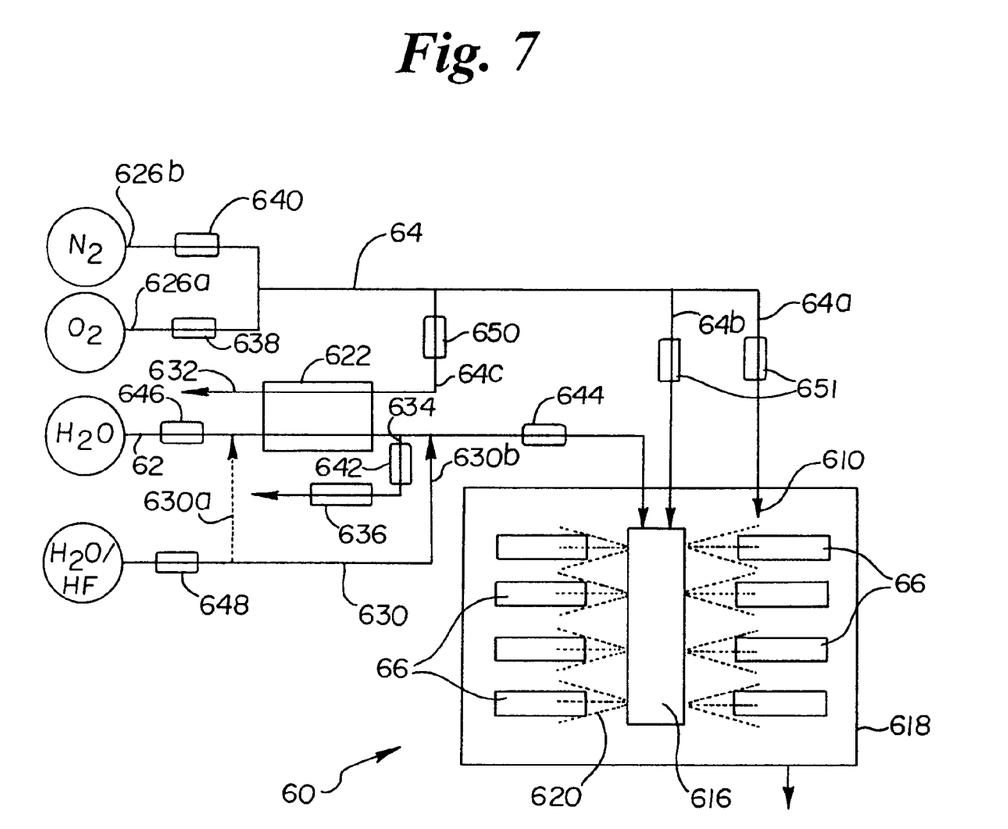
FIG. 7 is a detailed process diagram of a preferred embodiment of the system shown in FIG. 5.

A preferred embodiment of system 60 is illustrated in FIG. 7. The embodiment of system 60 shown in FIG. 7 is generally identical to system 60 illustrated in FIG. 6 with two primary exceptions. Firstly, not only is the matched gas blend precontacted with the water to predissolve oxygen in the water before the water enters chamber 618, but the very same matched gas blend is also supplied to spray post 616 (to be used as the atomizing gas) via matched gas supply line 64*b*. This is particularly advantageous, because the liquid chemical will therefore be atomized by a matched gas blend that is already in equilibrium with the concentration of dissolved $O_2$ in the liquid chemical. This means that substantially all of the predissolved oxygen in the water will stay in the water and will not be lost to the ambient when dispensed from spray post 616. Thus, a precise concentration of dissolved oxygen is established and maintained in the liquid chemical.

As a second difference, the very same matched gas blend is also delivered into chamber 618 via matched gas blend chamber supply line 64*a* through inlet port 610. Independently supplying the matched gas blend to chamber 618 further enhances the degree to which the interior of chamber 618 will be in equilibrium with the concentration of $O_2$ dissolved in the water. Even better control over maintaining the concentration of dissolved $O_2$ results. Flow through lines 64*b* and 64*c* is controlled by flow regulators 651.

The embodiment of system 60 shown in FIG. 7 is particularly advantageous because it can be used to prepare and dispense liquid chemicals with exceptional control over the concentration of dissolved gas in the liquid chemical at the time when the liquid chemical actually contacts substrates 66. Since any uncontrolled variation in dissolved gas concentration can adversely affect the rate, quality, repeatability, and /or other characteristics of treatment processes, especially etching processes, system 60 of FIG. 7 allows such processes to be carried out more effectively. For example, system 60 is easily able to prepare and dispense liquid chemical capable of etching copper at a rate of 0.1 nm/min to 25 nm/min, preferably 1 nm/min to 10 nm/min to provide an etched copper product whose thickness can be controlled to within 0.5 nm or less. In a batch cleaning system, etching preferably occurs at a rate of 1 nm/min. Single-wafer cleaning systems would operate at higher etch rates, preferably 10 nm/min.

Figure 8:
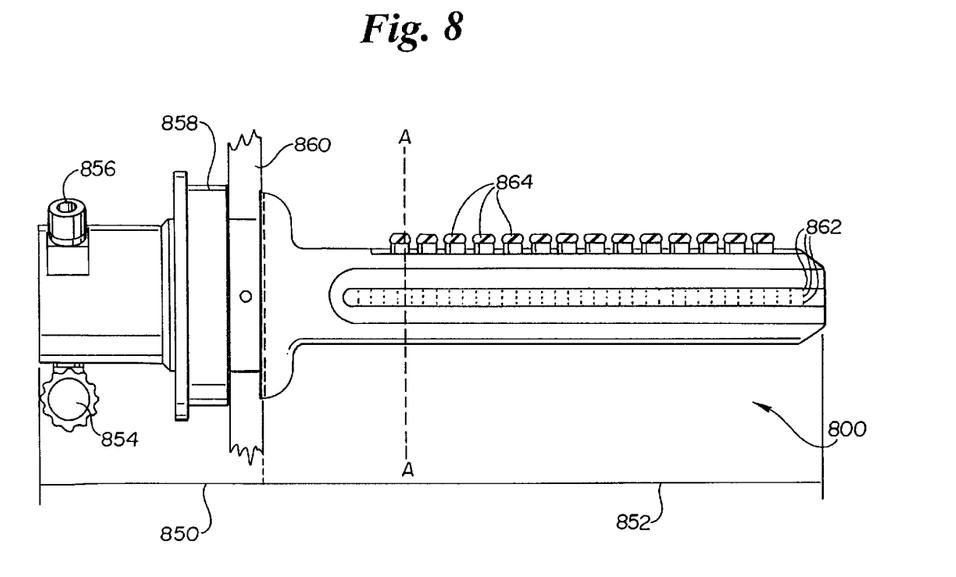
FIG. 8 is a side view of a spray post suitable for use as the atomizing nozzle in any one of the systems illustrated in FIGS. 1–7 and 10–13.
Figure 9:
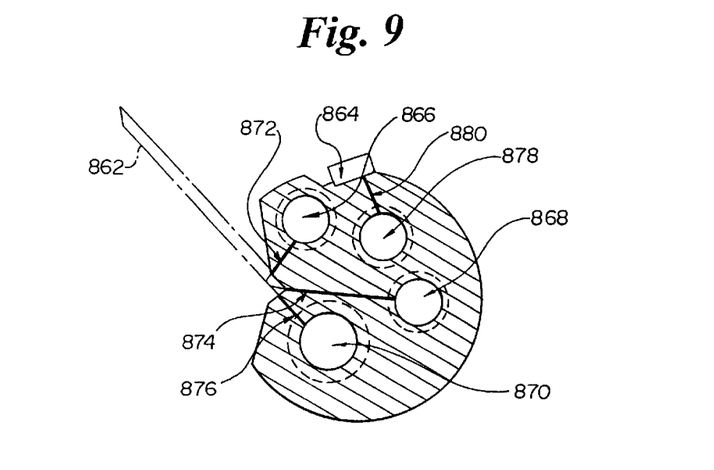
FIG. 9 is an enlarged cross-sectional view taken along line A—A of FIG. 8.

Referring now to FIGS. 8 and 9, there is illustrated a side view of a preferred embodiment of a spray post 800 suitable for use as the atomizing nozzle as illustrated in any one of the embodiments shown in FIGS. 1–7 and 11–13 of the present invention. Generally, spray post 800 is configured to atomizingly impact one or more fluid streams with each other such that droplets are formed and then allowed to contact the surface(s) to be treated.

Spray post 800 is capable of achieving such atomization by relying upon the principles of stream impingement to atomize the one or more fluid streams. More specifically, a stream of the liquid to be atomized and one or more other fluid streams (which can be another stream of the liquid or a different liquid, a stream of a nonreactive gas, such as $N_2$, a stream of the matched gas blend and/or a stream of some other fluid), can be impinged against each other under conditions such that a mist of very fine droplets is formed.

Spray post 800 is additionally capable of atomizing the liquid using a plurality of fan mechanisms to break up stream of the liquid into smaller droplets. That is, the fan mechanisms would operate to break the one or more fluid streams into sheets and/or droplets to be distributed onto the surface to be treated. Finally, spray post 800 is capable of dispensing the one or more fluid streams as steady streams, i.e., a stream of liquid comprising an amount of dissolved gas may be caused to flow through one orifice 862 of a triad of orifices 862 without being impinged with another stream of fluid.

As illustrated, spray post 800 comprises mounting flange 850 and nozzle 852. Mounting flange 850 comprises liquid inlet 854 for receiving liquid from a suitable source, while second fluid inlet 856 is adapted to receive a second fluid stream from a suitable source. In preferred embodiments, the second fluid stream comprises a second stream of liquid, a stream of the matched gas blend, an inert gas, such as nitrogen, or a combination thereof. Additionally, mounting flange 850 engages nut 858 for attaching mounting flange 850 to a member 860 (shown in part) of a chamber that would contain the substrates to be treated.

Nozzle 852 comprises a plurality of fixed orifices 862 arranged in triads, i.e., sets of three, distributed along the length of nozzle 852. Each triad of orifices is arranged so that the one or more fluid streams (at least one of which is the liquid) ejected from two or more of the triad orifices can be caused to impinge each other so as to atomize the fluid stream(s). That is, the orifices within each triad are preferably directed toward each other in such a manner that stream(s) of liquid ejected from one or more of the orifices will impinge, resulting in the stream(s) being broken up into droplets. Alternatively, liquid may be ejected from one of the triad orifices and not be caused to impinge with a second fluid stream, thereby resulting in the delivery of a steady stream of the liquid. Nozzle 852 further optionally includes a plurality of fans 864 distributed along the length of nozzle 852. Fans 864, in one embodiment of the system of the present invention, are used as an alternative to stream impingement in order to break the one or more fluid streams into sheets or droplets.

Nozzle 852 further comprises a number of internal longitudinal passages fluidly coupling second fluid inlet 856 and liquid inlet 854 to the plurality of fixed orifices 862. Specifically, there is provided longitudinal passages 866, 868, and 870 that are fluidly coupled to fixed orifices 862 by corresponding outlet passages 872, 874 and 876 associated with each orifice triad. Similarly, longitudinal passage 878 is fluidly coupled to each fan 864 by virtue of a corresponding outlet passage 880. Thus, for example, fluid transported through any of longitudinal passages 866, 868, and 870 is conveyed through outlet passages 872, 874 and 876, ejected from corresponding fixed orifices 862, and impinged in order to achieve atomization of the one or more fluid streams. In a similar fashion, fluid transported through longitudinal passage 878 is conveyed through outlet passage 880 and dispensed through fans 864, thereby breaking the fluid stream into sheets or droplets.

Figure 10:
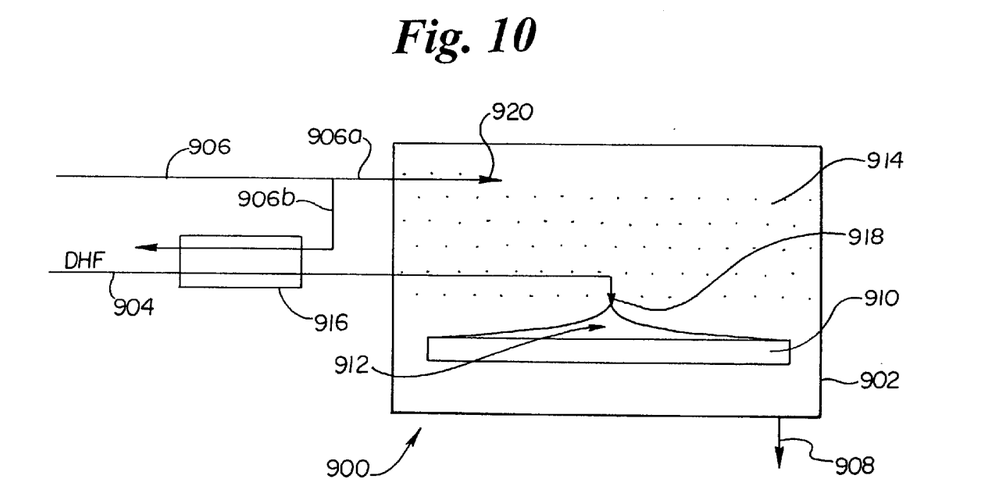
FIG. 10 is a schematic illustration of a seventh representative system capable of treating a single substrate with a liquid admixture comprising a dissolved gas in accordance with the present invention, wherein a liquid is precontacted with a matched gas blend to form a liquid admixture which is then dispensed as one or more fluid streams at the point of use in the presence of a matched gas blend.

Although the method and system of the present invention may be used to treat any number of substrates at the same time, in certain embodiments the method and system of the present invention may advantageously be used in a single wafer processing system. One such embodiment is illustrated in FIG. 10. FIG. 10 is a schematic representation of system 900 useful for treating substrate 910 with a liquid admixture comprising a dissolved gas. Generally, system 900 comprises chamber 902, liquid supply line 904, matched gas supply line 906 and exhaust and drain line 908. Chamber 902 houses substrate 910 that is to be treated upon contact with liquid admixture 912.

Liquid supply line 904 supplies liquid from a liquid source (not shown) into chamber 902. A matched gas blend 914 is supplied through matched gas supply line 906. Matched gas supply line 906 is bifurcated into supply line 906*a* and supply line 906*b*. Supply line 906*b* delivers matched gas blend 914 to gasifier 916, preferably in a direction counter to the flow of liquid through gasifier 916. Treatment in gasifier 916 causes the liquid to come to equilibrium with the matched gas blend. The resultant gasified liquid leaves gasifier 916 via liquid supply line 904. Liquid supply line 904 terminates at, and is operationally coupled to, dispensing nozzle 918. Dispensing nozzle 918 is structured such that the gasified liquid is dispensed into chamber 902 in the form of one or more streams of gasified liquid admixture 912. Additionally, matched gas chamber supply line 906*a* delivers matched gas blend 914 into chamber 902 through matched gas inlet 920.

Inside chamber 902, substrate 910 preferably is rotatably supported on a rotating turntable (not shown). While substrate 910 is being caused to rotate, liquid admixture 912 then contacts, and thereby treats, at least a portion of the surface of substrate 910. Advantageously, by using the same matched gas blend in gasifier 916 to predissolve gas in the liquid and to flood the point of use, a precise concentration of gas is established and maintained in the liquid.

Exhaust and drain line 908 is provided to withdraw matched gas blend 914 and/or used liquid from chamber 902. Additionally, any of lines 904, 906, 906*a*, 906*b* and 908 may optionally comprise a flow regulating device (not shown) to regulate the flow of liquid, matched gas blend, liquid/matched gas blend combinations or exhaust, as the case may be.

Figure 11:
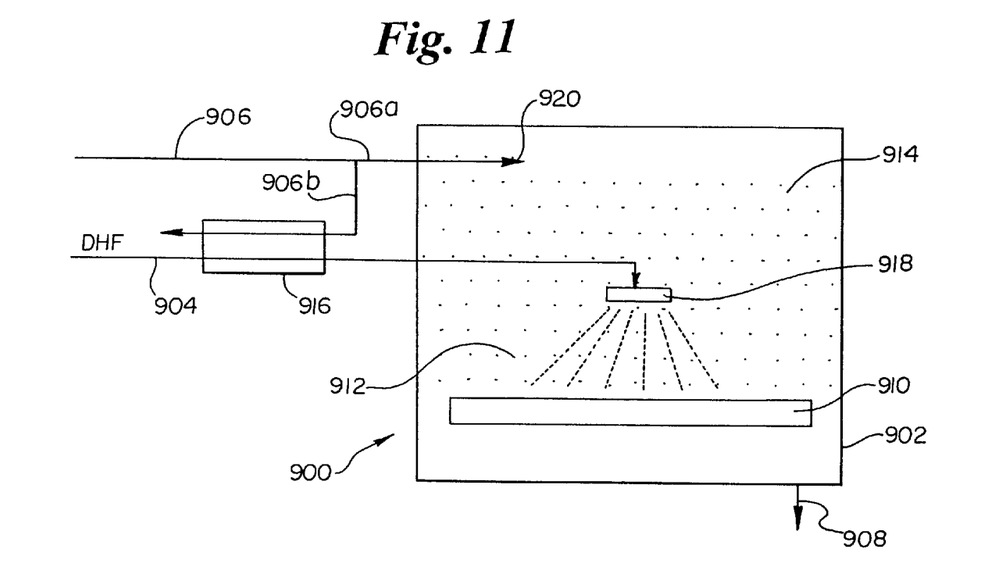
FIG. 11 is a schematic illustration of an eighth representative system capable of treating a single substrate with a liquid admixture comprising a dissolved gas in accordance with the present invention, wherein a liquid is precontacted with a matched gas blend to form a liquid admixture which is then dispensed at the point of use in the presence of a matched gas blend.

A second embodiment of a system 900 useful for treating a single substrate is illustrated in FIG. 11. The embodiment of system 900 shown in FIG. 11 is generally identical to system 900 illustrated in FIG. 10 with one primary exception. Namely, rather than dispensing the liquid admixture through a dispensing nozzle 918 that results in the liquid admixture being delivered in the form one or more fluid streams, the liquid admixture is dispensed through a dispensing nozzle 918 that results in the liquid admixture being delivered to the surface of the substrate 910 in the form of atomized droplets.

Figure 12:
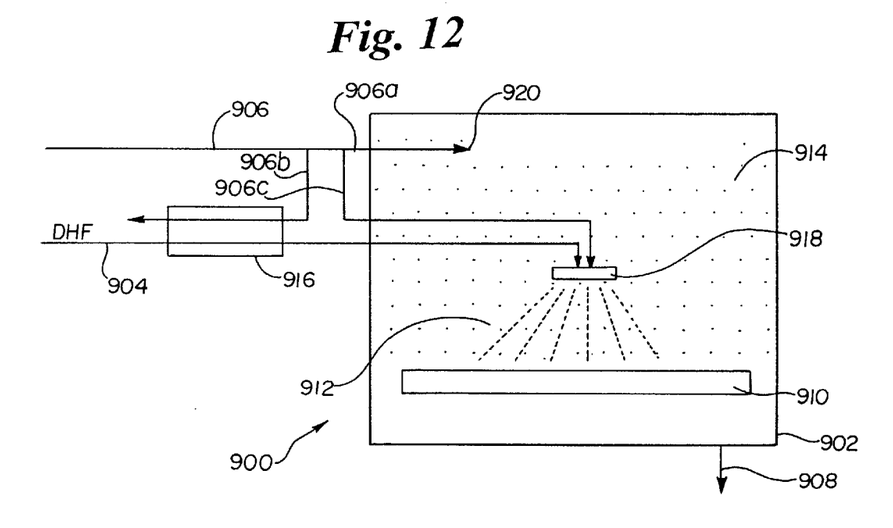
FIG. 12 is a schematic illustration of a ninth representative system capable of treating a single substrate with a liquid admixture comprising a dissolved gas in accordance with the present invention, wherein the liquid admixture is formed by precontacting a liquid with a matched gas blend which liquid admixture is subsequently atomized with a matched gas blend at the point of use in the presence of a matched gas blend.

A third embodiment of a system 900 useful for treating a single substrate is illustrated in FIG. 12. The embodiment of system 900 shown in FIG. 12 is generally identical to system 900 illustrated in FIG. 10 with two primary exceptions. First, the liquid admixture is dispensed through a dispensing nozzle 918 that results in the liquid admixture being delivered to the surface of the substrate 910 in the form of atomized droplets. Second, not only is the matched gas blend precontacted with the liquid to predissolve the matched gas blend in the liquid before the liquid enters chamber 902, but the very same matched gas blend is also supplied to dispensing nozzle 918 via matched gas blend/dispensing nozzle line 906*c* to be used as an atomizing gas. This is particularly advantageous, because the liquid comprising an amount of dissolved gas will therefore be atomized by a matched gas blend that is already in equilibrium with the concentration of dissolved gas in the liquid. This means that substantially all of the predissolved gas in the liquid will stay in the liquid and will not be lost to the ambient when dispensed from dispensing nozzle 918. Thus, a precise concentration of dissolved gas is established and maintained in the liquid.

Figure 13:
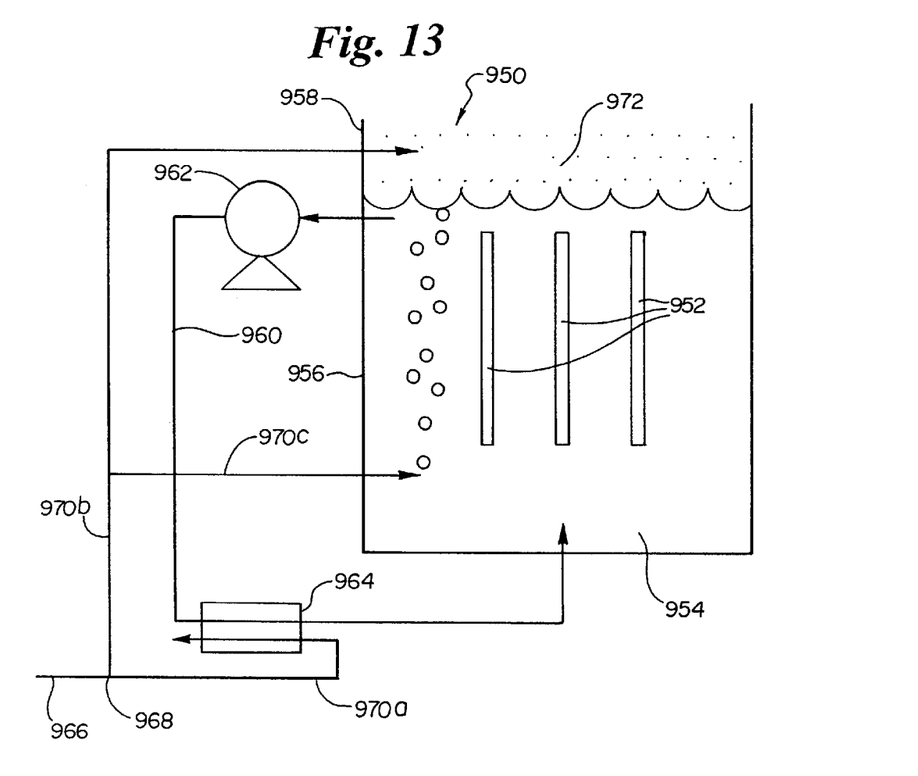
FIG. 13 is a schematic illustration of a tenth representative system capable of treating a plurality of substrates with a liquid admixture comprising a dissolved gas in accordance with the present invention, wherein the substrates are at least partially submerged in the liquid admixture which liquid admixture is formed by precontacting a liquid with a matched gas blend and dispensed at a point of use in the presence of a matched gas blend.

FIG. 13 shows one example of an immersion system 950 in which the principles of the present invention are used to treat substrates 952 by immersion in gasified liquid 954. System 950 includes tank 956 for holding liquid 954. Substrates 952 typically will be held in a cassette (not shown) that is completely immersed in liquid 954. As shown, tank 956 is open at the top 958 of tank 956, but the open top 958 could be covered if desired. Liquid 954 is recirculated through recirculation loop 960. Pump 962 is used to motivate liquid 954 through recirculation loop 960. Liquid 954 moving through recirculation loop 960 also passes through device 964 in which liquid 954 comes to equilibrium with a matched gas blend also being transported through device 964.

A suitable matched gas blend is supplied from a suitable source (not shown) via gas supply line 966. At juncture 968, gas supply line 966 splits into gas supply lines 970*a* and 970*b*. Gas supply line 970*a* is used to transport the matched gas blend through device 964, preferably in counter current fashion to liquid 954 being transported through device 964. Gas supply line 970*b* delivers the matched gas blend to the top 958 of tank 956, thereby forming a blanket 972 of the matched gas blend over the surface of liquid 954. Gas supply line 970*c* is joined to gas supply line 970*b* at juncture 974 in order to supply the matched gas blend directly into liquid 954.

Advantageously, system 950 allows the concentration of gas solute to be precisely maintained in liquid 954 to allow treatment of substrates 952 to be carried out with exceptional precision, control, consistency, and repeatability from batch to batch. Liquid in diffusional contact with gas blanket 972 comes to equilibrium with blanket 972, and gas blanket 972 also helps to ensure that very little if any of the gas solute is lost from the liquid. In short, gas blanket 972 is one way that system 950 establishes and maintains a precise concentration of gas solute in liquid 954. In the meantime, the matched gas blend is also bubbled through liquid 954 via supply line 970*c*. This is another way that system 950 establishes and maintains the precise concentration of gas solute in liquid 954. Further, recirculated liquid also comes to equilibrium with the matched gas blend via diffusional interaction within device 964, which further helps to establish and maintain the desired gas concentration in liquid 954.

The present invention will be described below with reference to the following representative examples.

EXAMPLE 1

A system like that of FIG. 7 was used to etch copper on several different semiconductor wafers using water containing dissolved oxygen and HF, except that the system did not include supply line 64*a* or outlet 610. The system was created by interfacing the gas and liquid supply hardware to an FSI MERCURY MP® cenrifugal spray processor commercially available from FSI International, Inc., Chaska, Minn. The system used the Pall Separel EFM 350 contactor as device 622.

A 1.6 liter/min flow of ultrapure deionized water was supplied to the contactor. The water temperature was typically 21° C. Oxygen was pre-contacted with the water by passing a flow of a matched gas blend through the contactor. The contactor treatment caused enough oxygen to dissolve in the water to be in equilibrium with the amount of oxygen vapor in the matched gas blend. The details of the matched gas blends used to treat each wafer are reported in Table 1, below. In each case, the matched gas blend was supplied at 200 liters per minute. Of the 200 liter/min flow, 30 liter/min was supplied to the contactor, and the remaining 170 liter/min was supplied to the spraypost. In some cases, no gas flowed in the contactor, resulting in 8 ppm of $O_2$ in the water.

The amount of dissolved oxygen in the treatment water was varied from wafer to wafer by varying the amount of oxygen included in the matched gas blend. For example, the "%$O_2$ in Atomization" listed in Table 1 indicates the volumetric flow rate fraction of $O_2$ in the matched gas blend. Thus, "35% $O_2$," indicates that 35%, or 70 liters/min of the overall 200 liter/min flow was $O_2$ and the balance, 130 liter/min, was nitrogen.

The HF was added to the oxygenated water by blending. Specifically, 0.4 liter/min of a solution including 0.5 weight percent HF in ultrapure deionized water (a solution of HF in water is referred to herein as "DHF") was blended into the 1.6 liter/min flow of oxygenated water.

The substrates that were tested included about a 1.8 micron layer of copper deposited onto a 200 mm silicon wafer substrate. The copper was deposited onto the wafers by using either chemical vapor deposition (CVD), physical vapor deposition (PVD), or electroplating (EPL). The copper on each substrate was then etched by treatment with the corresponding HF and oxygen-containing water. The copper etch rate was determined by -x-ray fluorescence (XRF) measurements taken before and after each etch. The etch was performed at 200 rpm with a standard rinse and dry sequence. The time of etching ranged from 60 to 300 seconds. The details of treatment for each substrate are summarized in Table 1:

TABLE 1

Results of etching Cu with HF:$O_2$

| Wafer # | Copper Type | % $O_2$ in Atom. | Temp ° C. | Time in seconds | Angstrom Etched | Etch Rate A/min |
|---|---|---|---|---|---|---|
| 1 | CVD | 0 | 21 | 300 | 19 | / |
| 2 | PVD | 0 | 21 | 300 | 9 | / |
| 3 | CVD | 0 | 21 | 60 | 13 | / |
| 4 | CVD | 0 | 21 | 60 | 14 | / |
| 5 | CVD | 0 | 21 | 60 | 11 | / |
| 6 | CVD | 65 | 21 | 300 | 777 | 153 |
| 7 | PVD | 65 | 21 | 300 | 814 | 160 |
| 8 | CVD | 32 | 21 | 60 | 91 | 78 |
| 9 | PVD | 32 | 21 | 60 | 93 | 80 |
| 10 | EPI | 32 | 21 | 120 | 126 | 56.5 |
| 11 | PVD | 32 | 21 | 120 | 141 | 64 |
| 12 | EPI | 32 | 21 | 120 | 139 | 63 |
| 13 | EPI | 32 | 21 | 120 | 131 | 59 |
| 14 | CVD | 32 | 21 | 120 | 134 | 65.5 |
| 15 | EPI | 32 | 21 | 300 | 349 | 67.5 |
| 16 | EPI | 10 | 21 | 300 | 152 | 27.8 |
| 17 | EPI | 5 | 21 | 300 | 95 | 18.8 |
| 18 | EPI | 0 | 21 | 300 | 13 | / |
| 19 | EPI | 32 | 40.7 | 275 | 745 | 146.4 |

From these results, it was determined that the etch rate, in angstroms per minute, depends upon the oxygen content in the matched gas blend in accordance with the following expression:

$$R = 0.0168C^2 + 1.1662C + 13.368$$

where R is the etch rate in angstroms per minute and C is the percentage of oxygen incorporated into the matched gas blend (reported in Table 1 as "%$O_2$ in Atom."). C is calculated by the expression 100%×$V_O$/$V_T$, where $V_O$ is the volumetric flow rate of oxygen incorporated into the matched gas blend and $V_T$ is the total volumetric flow rate of the matched gas blend. The expression shows that the etch rate R is essentially a linear function of C with only a small amount of curvature due to the small coefficient for $C^2$.

The data also show that both the amount of copper etched and the etch rate are very repeatable. For a given set of treatment conditions, the amount etched and the etch rate vary by less than 4% from the average, regardless of the deposition technique used to form the copper layer. For example, for the treatment involving C=32% for 60 seconds (wafers 8 and 9) the etch rates were 78 and 80 angstrom/min, respectively, and the amount etched was 91 and 93 angstroms, respectively. Good consistently was also obtained for the other treatment conditions.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of treating a substrate with a liquid admixture comprising a liquid and a desired concentration of a dissolved select gas, comprising the steps of:

(a) providing a matched gas blend that comprises a concentration of the select gas that is to be dissolved in the liquid, that concentration being based upon the ability thereof to be in equilibrium with the desired concentration of the dissolved select gas in the liquid;

(b) atomizing the liquid in the presence of the matched gas blend to form an atomized liquid admixture comprising the liquid and the desired concentration of the dissolved select gas; and (c) causing the atomized liquid admixture to contact the substrate.

2. The method of 1, wherein the substrate comprises a semiconductor wafer.

3. The method of claim 1, wherein the atomizing step comprises causing a first fluid stream comprising the liquid to impact at least a second fluid stream.

4. The method of claim 3, wherein the second fluid stream comprises the matched gas blend.

5. The method of claim 3, wherein the second fluid stream comprises the liquid.

6. The method of claim 3, wherein each of the first and second streams comprises an amount of the matched gas blend.

7. The method of claim 1, wherein the step of causing the atomized liquid admixture to contact the substrate causes at least a portion of a surface of the substrate to be etched.

8. The method of claim 7, wherein the atomized liquid admixture comprises water, oxygen, and aqueous hydrofluoric acid in respective amounts effective to etch the substrate at a rate from 0.1 nm/min to 100 nm/min.

9. The method of claim 7, wherein the surface comprises copper.

10. The method of claim 1, further comprising, prior to the step of atomizing, the step of contacting the liquid with the matched gas blend in a manner such that the liquid admixture substantially comprises the desired concentration of the dissolved select gas.

11. The method of claim 3, further comprising the step of positioning the substrate in a chamber, and wherein the step of atomizing the liquid in the presence of the matched gas blend comprises causing the chamber to include an amount of the matched gas blend.

12. The method of claim 11, further comprising, prior to the step of atomizing, the step of contacting the liquid with the matched gas blend in a manner such that the liquid admixture substantially comprises the desired concentration of the dissolved select gas.

13. The method of claim 1, wherein the matched gas blend comprises the gas to be dissolved in the liquid and an inert gas.

14. The method of claim 13, wherein the gas to be dissolved comprises oxygen and the inert gas comprises nitrogen.

15. The method of claim 1, further comprising, prior to the step of atomizing, the step of blending an auxiliary liquid admixture into the liquid.

16. The method of claim 15, wherein the auxiliary liquid admixture comprises aqueous hydrofluoric acid.

17. A method of treating a substrate with a liquid admixture comprising a liquid and a desired concentration of a dissolved select gas, comprising the steps of:

(a) providing a matched gas blend comprising a concentration of the select gas to be dissolved in the liquid, that concentration being based upon the ability thereof to be in equilibrium with the desired concentration of the dissolved select gas in the liquid;

(b) causing the matched gas blend to contact the liquid to form the liquid admixture in a manner such that the liquid admixture substantially comprises the desired concentration of the dissolved select gas; and (c) causing the liquid admixture to contact the substrate.

18. The method of claim 17, wherein step (c) further comprises the steps of atomizing the liquid admixture and causing the atomized liquid admixture to contact the substrate.

19. The method of claim 18, wherein the step of atomizing the liquid admixture comprises atomizing the liquid admixture in the presence of the matched gas blend.

20. The method of claim 19, further comprising the step of positioning the substrate in a chamber, and wherein the step of atomizing the liquid in the presence of the matched gas blend comprises causing the chamber to include an amount of the matched gas blend.

21. The method of claim 18, wherein the step of atomizing comprises causing a first fluid stream comprising the liquid to impact at least a second fluid stream.

22. The method of claim 21, wherein the second stream comprises the matched gas blend.

23. The method of claim 21, wherein the second fluid stream comprises the liquid.

24. The method of claim 17, wherein the step of causing the liquid admixture to contact the substrate causes at least a portion of a surface of the substrate to be etched.

25. The method of claim 24, wherein the liquid admixture comprises water, oxygen, and aqueous hydrofluoric acid in respective amounts effective to etch the substrate at a rate from 0.1 nm/min to 100 nm/min.

26. The method of claim 24, wherein the surface comprises copper.

27. A system for contacting a substrate with a liquid admixture comprising a liquid and a desired concentration of a dissolved select gas, said system comprising:

(a) a chamber in which at least one substrate can be positioned for treatment with the liquid admixture;

(b) a liquid supply;

(c) a liquid supply line in fluid communication with the chamber though which liquid can be provided from the liquid supply and dispensed into the chamber;

(d) a supply of a matched gas blend that comprises a concentration of the select gas to be dissolved, that concentration being based upon the ability thereof to be in equilibrium with the desired concentration of the dissolved select gas in the liquid; and (e) at least one gas supply line in fluid communication with the chamber through which the matched gas blend can be dispensed into the chamber concurrently with the liquid supply and wherein the at least one matched gas supply line is in mass transfer contact with the liquid supply line so that the matched gas blend is caused to contact the liquid so that the select gas can be dissolved into the liquid.

28. The system of claim 27, further comprising an atomizing nozzle operationally coupled to the liquid supply line so that the liquid supply is atomizingly dispensed from the liquid supply line into the chamber through said nozzle.

29. The system of claim 28, wherein the nozzle comprises at least one set of complementary passageways through which first and second streams comprising the liquid supply can be ejected to atomizingly impact each other to generate a plurality of atomized droplets in the chamber.

30. The system of claim 28, wherein the atomizing nozzle is operationally coupled to the gas supply line so that at least a portion of the matched gas supply is dispensed from the gas supply line into the chamber through said nozzle, and wherein the nozzle comprises at least one set of complementary passageways through which a first stream comprising the liquid supply and a second stream comprising the matched gas supply can be ejected under conditions such that the stream comprising the matched gas supply atomizingly impacts the stream comprising the liquid supply to generate a plurality of atomized droplets in the chamber.

31. The system of claim 27, wherein the at least one gas supply line further comprises a conduit fluidly coupled to the chamber so that at least a portion of the matched gas supply can be dispensed into the chamber without passing through the nozzle.

32. A method of treating a substrate with a liquid admixture comprising a liquid and a desired concentration of a dissolved select gas comprising the steps of:

(a) providing a matched gas blend comprising a concentration of the select gas to be dissolved, that concentration being based upon the ability thereof to be in equilibrium with the desired concentration of the dissolved select gas in the liquid;

(b) atomizing the liquid with the matched gas blend to form an atomized liquid admixture comprising the liquid and the desired concentration of the dissolved select gas; and (c) causing the atomized liquid admixture to contact the substrate.

* * * * *